(12) United States Patent
Lakkis

(10) Patent No.: US 8,583,995 B2
(45) Date of Patent: Nov. 12, 2013

(54) MULTI-MODE PROCESSOR

(75) Inventor: Ismail Lakkis, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1663 days.

(21) Appl. No.: 11/732,014

(22) Filed: Apr. 2, 2007

(65) Prior Publication Data

US 2007/0245221 A1 Oct. 18, 2007

(51) Int. Cl.
*H03M 13/00* (2006.01)
(52) U.S. Cl.
USPC .......................................................... 714/783
(58) Field of Classification Search
USPC .......................................................... 714/783
See application file for complete search history.

(56) References Cited

U.S. PATENT DOCUMENTS

| | | | |
|---|---|---|---|
| 3,622,982 A | 11/1971 | Clark, Jr. et al. | |
| 4,346,475 A | 8/1982 | Alexis | |
| 4,397,022 A | 8/1983 | Weng et al. | |
| 4,849,976 A | 7/1989 | Schilling et al. | |
| 4,901,317 A | 2/1990 | Rushforth et al. | |
| 4,926,422 A | 5/1990 | Alaria et al. | |
| 4,933,956 A | 6/1990 | Forney, Jr. | |
| 5,717,871 A * | 2/1998 | Hsieh et al. | 710/317 |
| 5,805,613 A | 9/1998 | Beery et al. | |
| 5,914,933 A | 6/1999 | Cimini et al. | |
| 5,968,199 A | 10/1999 | Khayrallah et al. | |
| 6,005,840 A | 12/1999 | Awater et al. | |
| 6,134,261 A | 10/2000 | Ryan | |
| 6,189,125 B1 | 2/2001 | Classon | |
| 6,324,668 B1 | 11/2001 | Classon | |
| 6,404,732 B1 | 6/2002 | Van Nee | |
| 6,452,958 B1 | 9/2002 | Van Nee | |
| 6,453,168 B1 | 9/2002 | McCrady et al. | |
| 6,567,482 B1 | 5/2003 | Popovic | |
| 6,643,281 B1 | 11/2003 | Ryan | |
| 6,658,632 B1 * | 12/2003 | Parulkar et al. | 716/101 |

(Continued)

FOREIGN PATENT DOCUMENTS

| | | |
|---|---|---|
| EP | 1953924 A1 | 8/2006 |
| JP | 2002280942 A | 9/2002 |

(Continued)

OTHER PUBLICATIONS

Sivaswamy, R. "Multiphase Complementary Codes," IEEE Transactions on Information Theory, vol. IT-24, No. 5, Sep. 1978.

(Continued)

*Primary Examiner* — Albert Decady
*Assistant Examiner* — Enam Ahmed
(74) *Attorney, Agent, or Firm* — Dang M. Vo

(57) ABSTRACT

An apparatus is configured to perform both Fourier transform processing and Golay code processing. Each of a plurality of processing elements comprises a delay element configured for providing a predetermined delay to at least a first input signal, at least one seed vector insertion element configured for multiplying at least a second input signal by at least one seed-vector value for producing at least one scaled input signal value, and at least one multiplexer configurable by at least one control signal for selecting an operating mode of the apparatus. At least one twiddle-factor multiplier is coupled between stages of the processing elements and employed for Fourier transform processing. The apparatus may be configured to perform both multi-mode and multi-band operation.

33 Claims, 14 Drawing Sheets

(56) References Cited

U.S. PATENT DOCUMENTS

| | | | |
|---|---|---|---|
| 6,661,854 | B2 | 12/2003 | Rudolf et al. |
| 6,674,819 | B2 | 1/2004 | Rudolf et al. |
| 6,795,513 | B2 | 9/2004 | Jechoux et al. |
| 6,804,191 | B2 | 10/2004 | Richardson |
| 6,839,876 | B1 | 1/2005 | Tong et al. |
| 6,895,258 | B1 | 5/2005 | Scherzer et al. |
| 6,922,406 | B2 | 7/2005 | Rudolf et al. |
| 6,977,974 | B1 | 12/2005 | Geraniotis et al. |
| 6,996,418 | B2 | 2/2006 | Teo et al. |
| 7,010,071 | B1 | 3/2006 | Michel et al. |
| 7,039,036 | B1 | 5/2006 | Dabak et al. |
| 7,042,868 | B2 | 5/2006 | Runkle et al. |
| 7,062,002 | B1 | 6/2006 | Michel et al. |
| 7,106,787 | B2 | 9/2006 | Chang et al. |
| 7,116,650 | B2 | 10/2006 | Takeuchi et al. |
| 7,130,586 | B2 | 10/2006 | Corbett et al. |
| 7,289,588 | B2 | 10/2007 | Suh et al. |
| 7,292,641 | B2 | 11/2007 | Suh et al. |
| 7,356,008 | B2 | 4/2008 | Mottier et al. |
| 7,400,654 | B2 | 7/2008 | Raaf |
| 7,483,367 | B2 | 1/2009 | Chayat et al. |
| 7,486,737 | B2 | 2/2009 | Trainin et al. |
| 7,508,866 | B2 | 3/2009 | Chang et al. |
| 7,616,622 | B2 | 11/2009 | Rudolf et al. |
| 7,680,230 | B2 | 3/2010 | Koppelaar |
| 7,684,473 | B2 | 3/2010 | Walton et al. |
| 7,711,032 | B2 | 5/2010 | Diaz Fuente |
| 7,817,967 | B2 | 10/2010 | Karabinis et al. |
| 2004/0071195 | A1 | 4/2004 | Huang et al. |
| 2004/0213145 | A1 | 10/2004 | Nakamura |
| 2006/0245505 | A1 | 11/2006 | Limberg |
| 2007/0014331 | A1 | 1/2007 | Eldon et al. |
| 2007/0113159 | A1 | 5/2007 | Lakkis |
| 2007/0168841 | A1 | 7/2007 | Lakkis |
| 2009/0097533 | A1 | 4/2009 | Lakkis |
| 2009/0100316 | A1 | 4/2009 | Lakkis |
| 2009/0100317 | A1 | 4/2009 | Lakkis |
| 2009/0110031 | A1 | 4/2009 | Lakkis |
| 2009/0125792 | A1 | 5/2009 | Lakkis |
| 2009/0201974 | A1 | 8/2009 | Song et al. |
| 2011/0209035 | A1 | 8/2011 | Lakkis |

FOREIGN PATENT DOCUMENTS

| | | | |
|---|---|---|---|
| JP | 2004515935 | A | 5/2004 |
| JP | 20044364285 | A | 12/2004 |
| WO | WO03047140 | A1 | 6/2003 |
| WO | WO2007056948 | A1 | 5/2007 |

OTHER PUBLICATIONS

IEEE 802.11b, "Part 11: Wireless LAN Medium Access Control (MAC) and Physical Layer (PHY) specifications: Higher-Speed Physical Layer Extension in the 2.4 GHz Band, " Sep. 16, 1999.

Budisin, S.Z., "Efficient pulse compressor for Golay complementary sequences," Electronics Letters, 27, No. 3, pp. 219-220, Jan. 31, 1991.

IEEE 802.15.3c, "Part 15.3; Wireless Medium Access Control (MAC) and Physical Layer (PHY) Specifications for High Rate Wireless Personal Area Network (WPANs)," Amendment 2; Millimeter-wave-based, Alternative Physical Layer Extension, (Amendment to IEEE std 802.15.3-2003), Oct. 12, 2009, pp 1-187.

Cheolhee Park et al.; "Short-Range Wireless Communications for Next-Generation Networks: UWB. 60 GHz Millimeter-Wave WPAN, and ZigBee" IEEE Wireless Communications; IEEE Service Center, Piscataway, NJ, US, col. 14, No. 4, Aug. 1, 2007, XP011191781.

Domenico Antonio Fittipaloi et al.; "ieee 802.15.3c Medium Access Controller Throughput for Phased Array Systems"IEEE International Symposium on Personal Indoor and Mobile Radio Communications. PIMRC. IEEE, PI, XX Sep. 1, 2007 XP031168545.

Fumihide Kojima et al.: "Necessary Modifications on Conventional IEEE802.15.3b MAC to Achieve IEEE802.15.3c Millimeter Wave WPAN" IEEE International Symposium on Personal, Indoor and Mobile Radio Communications, PIMRC, IEEE; PI, XX, Sep. 1, 2007, XP031168693.

Golay M J E: "Complementary Series" IRE Transactions on Information Theory, IEEE Inc. New York, US, vol. IT-07, No. 2, Apr. 1, 1961, XP009050014.

Guangqi Yang et al: "Design of Synchoronization Sequences in a MIMO Demonstration System" Wireless Communications and Applied Computational Electromagnetics, 20 05. IEEE/ACES International Conference on Honolulu, HI Apr. 3-7, 2005, Pascataway, NJ, USA, IEEE, Apr. 3, 2005, pp. 40-43, XP010826457.

Hiroshi Harada: "IEEE 802.15-07-0761-10-003c Unified and flexible millimeter wave WPAN systems supported by common mode" TG3C, Sep. 18, 2007 XP002508475.

Lakkis I. et al: "IEEE 802.15-0760-03-003c mmWave OFDM Physical Layer Proposal" IEEE 802.15 TG3C, Sep. 19, 2007 19, XP002507726.

Nortel Networks: "Clarifications on Golay-Hadamard Sequence Based RACH Preamble"3GPP Draft; R1-99C28, 3rd Generation Partnership Project (3GPP), Mobile Competence Centre; 650, Route Des Lucioles; F-06921 Sophia-Anitpolis Cedex; France, vol.tsg_ran\WG1_RL1/TSGR1$_{13}$ 07/Docs/Pdfs, no. Hannover; 19990830, Aug. 26, 1999, XP050089422.

Pengfei Xia et al: "Short Range Gigabit Wireless Comunications Systems: Potentials, Challenges and Techniques" Ultra_Wideband, 2007. ICUWB 2007. IEEE International Confernece on, IEEE, PI Sep. 1, 2007 XP031159333.

Ryuhei Funada et al: "A design of single carrier based PHY for IEEE 802.15.3c standard" IEEE International Symposium on Personal Indoor and Mobile Radio Communications. PIMRC, IEEE;PI, XX, Sep. 1, 2007, XP031168950.

Chung, "Optical Orthogonal codes: Design, Analysis and Applications", May 1989, IEEE vol. 35 No. 3, pp. 595-604.

Bulumulla, "A systematic approach to defecting OFMD signals in a fading channel", May 2000, IEEE, vo. 48, No. 5, pp. 1-4.

\* cited by examiner

| Configuration | $f_c$ | $f_X$ | ADC/BW | $f_M$ | M | N | P | Q |
|---|---|---|---|---|---|---|---|---|
| I | 58.32 GHz | 45.00 MHz | 2 | 1822.5 MHz | 6 | 3 | 8 | 27 |
| I | 60.48 GHz | 45.00 MHz | 2 | 1890.0 MHz | 6 | 3 | 8 | 28 |
| I | 62.64 GHz | 45.00 MHz | 2 | 1957.5 MHz | 6 | 3 | 8 | 29 |
| I | 64.80 MHz | 45.00 MHz | 2 | 2025.0 MHz | 6 | 3 | 8 | 30 |
| II | 58.32 GHz | 45.00 MHz | 2 | 1215.0 MHz | 2 | 3 | 8 | 27 |
| II | 60.48 GHz | 45.00 MHz | 2 | 1260.0 MHz | 2 | 3 | 8 | 28 |
| II | 62.64 GHz | 45.00 MHz | 2 | 1305.0 MHz | 2 | 3 | 8 | 29 |
| II | 64.80 MHz | 45.00 MHz | 2 | 1350.0 MHz | 2 | 3 | 8 | 30 |
| III | 58.32 GHz | 45.00 MHz | 1.5 | 607.50 MHz | 6 | 1 | 2 | 27 |
| III | 60.48 GHz | 45.00 MHz | 1.5 | 630.00 MHz | 6 | 1 | 2 | 28 |
| III | 62.64 GHz | 45.00 MHz | 1.5 | 652.50 MHz | 6 | 1 | 2 | 29 |
| III | 64.80 MHz | 45.00 MHz | 1.5 | 675.00 MHz | 6 | 1 | 2 | 30 |

Figure 8

MULTI-MODE PROCESSOR

CROSS-REFERENCE TO RELATED APPLICATION

This application claims priority to commonly owned and co-pending U.S. patent application Ser. No. 11/599,725, filed Nov. 15, 2006, which claims priority to U.S. Patent Application Ser. No. 60/737,065, filed Nov. 16, 2005, entitled "High Data Rate Ultra-Wide Band."

BACKGROUND OF THE INVENTION

I. Field of the Invention

The present invention relates generally to processing both single-carrier and multicarrier signals, and particularly to sharing components of a processor for processing both Golay-coded signals and OFDM signals.

II. Description of the Related Art

Within millimeter-wave communications, several different types of networks, each with their own communication protocols are envisioned. For example, there are Local Area Networks (LANs), Personal Area Networks (PANs), Wireless Personal Area Networks (WPANs), sensor networks and others. Each network may have its own communication protocol.

In one aspect of the related art, a Physical Layer supporting single carrier and OFDM modulation may be used for millimeter wave (e.g., 60 GHz) communications. In this case, the bandwidth is approximately 2.0 GHz, with a chip rate of 0.5 ns. Wireless communication systems typically employ data multiplexing for allowing multiple users or devices to share access to the communication system. Some wireless communications systems are designed to support simultaneous data transmission among multiple devices and multiple groups of devices. A group or network of devices having data connection among each other is sometimes referred to as a piconet, which is defined as a logical group of two or more devices communicating with each other.

Different piconets may employ different transmission modes (e.g., single-carrier and OFDM modes). Furthermore, multiple transmission modes may be supported within a single piconet. Therefore, it is often advantageous for a transceiver to support multiple transmission modes.

A single-carrier transceiver in an IEEE802.15.3c network typically employs at least one Golay-code generator to provide Golay codes to all of the fields of a transmitted data frame and to perform matched-filtering of a received Golay-coded signal. Complementary codes, first introduced by Golay, are sets of finite sequences of equal length such that the number of pairs of identical elements with any given separation in one sequence is equal to the number of pairs of unlike elements having the same separation in the other sequences. S. Z. Budisin, "Efficient pulse compressor for Golay complementary sequences," *Electronic Letters*, 27, no. 3, pp. 219-220, 31 Jan. 1991, which is hereby incorporated by reference, shows a transmitter for generating Golay complementary codes as well as a Golay matched filter.

An OFDM transceiver typically employs a Fourier transform, such as a fast Fourier transform (FFT) and an inverse FFT (IFFT), and may optionally employ a Golay-code processor for processing Golay-coded preamble and/or header fields of a data frame. Furthermore, a receiver configured to perform frequency-domain equalization of a single-carrier signal may comprise an FFT/IFFT processor.

Since there is a need for transceivers to perform both Fourier transform processing and Golay processing, it would be advantageous to provide for a single processor configured to process signals in a plurality of transmission modes. Furthermore, it would be advantageous if common hardware elements may be employed for performing Fourier processing and Golay processing.

SUMMARY OF THE INVENTION

Embodiments disclosed herein may be advantageous to systems employing single-carrier and OFDM signals used in 60 GHz millimeter wave systems, such as defined by the IEEE802.15.3c protocol. However, the invention is not intended to be limited to such systems, as other applications may benefit from similar advantages.

In one embodiment of the invention, a system is configured to perform both Fourier transform processing and Golay code processing. The system comprises a multi-stage processing means having a plurality of processing stages and a twiddle-factor multiplication means coupled between at least two of the processing stages. Each processing stage comprises a delaying means, a seed vector insertion means, and a multiplexing means.

The delaying means is configured for providing a predetermined delay to at least a first input signal. The delaying means may include, by way of example, but without limitation, one or more delay elements, including programmable delay elements.

The seed vector insertion means is configured for multiplying at least a second input signal by at least one seed-vector value for producing at least one scaled input signal value. The seed vector insertion means may include, by way of example, but without limitation, one or more multipliers configured for multiplying a signal by at least one seed vector. In one embodiment, the seed vector insertion means may include multiplexing means configured for selecting at least one of a plurality of scaled input signal values.

The multiplexing means is configurable by at least one control signal for selecting an operating mode of the apparatus. The multiplexing means may include, by way of example, but without limitation, one or more multiplexers responsive to at least one control signal for multiplexing at least one of a plurality of signals in the processing stages. The multiplexing means controls the signal processing in the processing stages to perform at least one of Golay processing and Fourier transform processing (e.g., FFT and/or IFFT processing).

The twiddle-factor multiplication means is coupled to at least one output of at least one of the plurality of processing elements. The twiddle-factor multiplication means may include, by way of example, but without limitation, one or more multipliers configured for multiplying at least signal output by at least one twiddle factor used in a Fourier transform. In one embodiment, the twiddle-factor multiplication means comprises a multiplying means coupled to at least one memory-storage means. In another embodiment, the twiddle-factor multiplication means comprises a multiplexing means coupled to a second multiplying means.

In an alternative embodiment, the system is configured for Fourier transform processing and bypassing the twiddle-factor multiplication means to perform a fast Walsh-Hadamard transform. In one embodiment, the system is configured to perform matched filtering for Golay codes having a plurality of lengths. In another embodiment, the system is configured as a parallel processor. The system may be configured for processing both transmit signals and received signals. Other embodiments of the invention may comprise a digital computer system programmed to perform a method of the invention and/or a computer-readable medium storing a computer program implementing any of the methods of the inventions.

Although particular embodiments are described herein, many variations and permutations of these embodiments fall within the scope and spirit of the invention. Although some benefits and advantages of the preferred embodiments are mentioned, the scope of the invention is not intended to be limited to particular benefits, uses, or objectives. Rather, embodiments of the invention are intended to be broadly applicable to different wireless technologies, system configurations, networks, and transmission protocols, some of which are illustrated by way of example in the figures and in the following description of the preferred embodiments. The detailed description and drawings are merely illustrative of the invention rather than limiting, the scope of the invention being defined by the appended claims and equivalents thereof.

BRIEF DESCRIPTION OF THE DRAWINGS

Embodiments according to the present invention are understood with reference to the following figures.

FIG. 8 illustrates operating parameters employed in some of the possible embodiments of the invention

Figure 1:
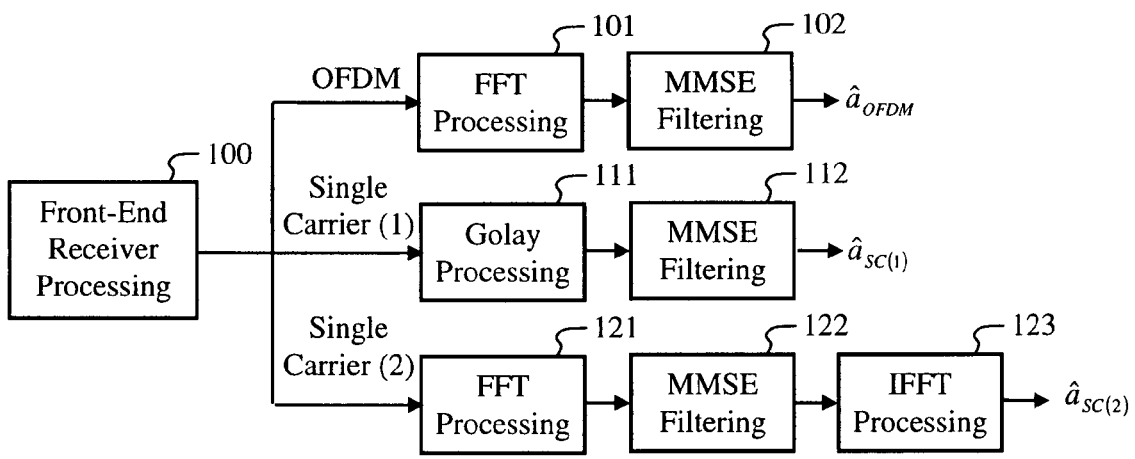
FIG. 1 illustrates a multi-mode receiving method for processing a plurality of received signal modes in accordance with one embodiment of the invention.

DESCRIPTION OF PREFERRED
EMBODIMENTS

While the invention is susceptible to various modifications and alternative forms, specific embodiments thereof have been shown by way of example in the drawings and are herein described in detail. It should be understood, however, that it is not intended to limit the invention to the particular form disclosed, but rather, the invention is to cover all modifications, equivalents, and alternatives falling within the spirit and scope of the invention as defined by the claims.

In accordance with one embodiment of the invention, a multi-mode processor for processing received single-carrier and OFDM signals is configured to employ a set of delay elements for both Golay processing and Fourier processing. FIG. 1 illustrates a multi-mode receiving method for processing a plurality of received signal modes in accordance with one embodiment of the invention. Front-end processing 100 is performed on the received signal to produce a digital baseband signal. In this embodiment, front-end processing may further comprise determining which of a plurality of signal modes is in the received signal before the signal is routed to a corresponding sequence of baseband processing steps.

If the received signal is determined to be an OFDM signal, the digital baseband signal undergoes fast Fourier transform (FFT) processing 101, followed by filtering, such as minimum mean squared error (MMSE) filtering 102. Other types of filtering may be employed, such as is well known in the art. In OFDM, the received signal model may be expressed as $$x_n A_n \otimes h_n + w_n \; n=0:N-1,$$

where $A_{0:N-1}$ denotes an inverse FFT (IFFT) of length N of a data block $a_{0:N-1}$, $h_{0:N-1}$ represents multipath channel taps, $w_{0:N-1}$ is additive white Gaussian noise with variance $\sigma^2$, and the symbol $\otimes$ denotes cyclic convolution. The FFT of the received signal is expressed by $$X_n = a_n \times H_n + W_n \; n=0:N-1$$

where $H_{0:N-1}$ denotes complex frequency-domain channel coefficients, and $W_{0:N-1}$ is additive white Gaussian noise.

MMSE filtering 102 provides estimated data symbols $$\hat{a}_n = X_n \times \frac{H_n^*}{|H_n|^2 + \sigma^2} \; n = 0:N-1.$$

However, any type of filtering may be employed, and such filters may employ hard decision symbol estimation, soft-decision symbol estimation, or any combination thereof.

A single-carrier signal may be processed by Golay filtering 111, which detects the preamble and decodes the header and data, and it may be followed by filtering, such as MMSE filtering 112 for producing data symbol estimates.

In another embodiment, the single-carrier signal may be processed in the frequency domain. The received single-carrier signal is expressed by a block of N symbols:

$$x_n = a_n \otimes h_n + w_n \; n=0:N-1$$

FFT processing 121 of the block produces frequency-domain symbols:

$$X_n = A_n H_n + W_n \; n=0:N-1$$

Wiener (MMSE) filtering 122 produces estimates of the frequency-domain symbols:

$$\hat{A}_n = X_n \times \frac{H_n^*}{|H_n|^2 + \sigma^2} \; n = 0:N-1$$

The symbol estimates may comprise hard decisions, soft decisions, or any combination thereof. In each of the filtering steps shown herein, the noise variance may be estimated for one or more symbols at a time, or a fixed value may be used.

An IFFT 123 of the frequency-domain symbol estimates produces the estimated data symbols:

$$\hat{a}_n = \text{IFFT}[\hat{A}_n] \; n=0:N-1.$$

Embodiments of the invention may be configured for processing single carrier signals with or without a cyclic prefix. Without a cyclic prefix, an overlap-and-save method or an overlap-and-add method may be employed.

Since OFDM employs an FFT at the receiver, single carrier with Golay coding employs a Golay filter, and single carrier with frequency-domain processing employs both an FFT and an IFFT, it would be advantageous to a single processor configured to perform FFT, IFFT and Golay code filtering for any spreading-code length. For example, one embodiment of the invention may provide for Golay filtering that reuses processing elements employed in FFT/IFFT processing.

Figure 2A:
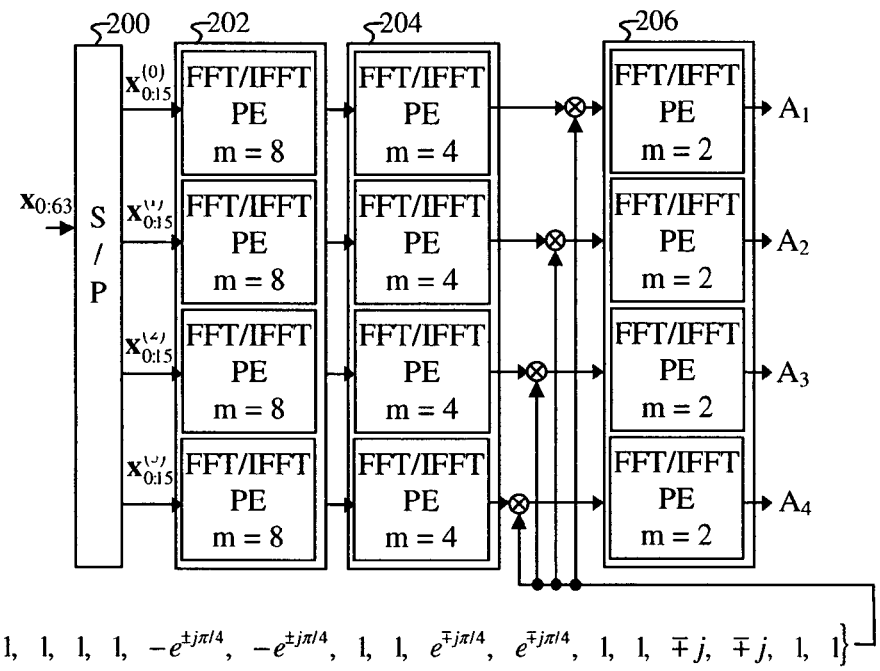
FIGS. 2A and 2B illustrates a method and apparatus configured for performing FFT/IFFT processing in accordance with an embodiment of the invention.
Figure 2B:
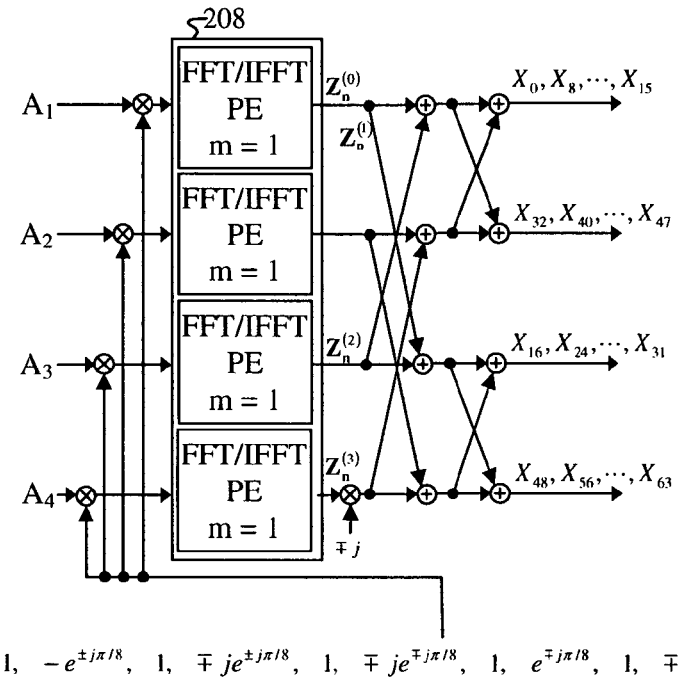

FIGS. 2A and 2B illustrates a method and apparatus of the invention configured in a mode for FFT/IFFT processing where N=64 and a parallel factor of four is implemented. An input vector $x_{0:63}$ is divided into four inputs, $$x_{0:15}^{(0)} = x_0, x_4, \ldots, x_{60}$$
$$x_{0:15}^{(1)} = x_1, x_5, \ldots, x_{61}$$
$$x_{0:15}^{(2)} = x_2, x_6, \ldots, x_{62}$$
$$x_{0:15}^{(3)} = x_3, x_7, \ldots, x_{63}$$

and an output vector $X_{0:63}$ is generated at four outputs. The output vector values $X_n$ are given by $$X_n = \sum_{k=0}^{63} x_k W_N^{nk} \; n = 0:63$$

$$W_N = e^{\pm j \frac{2\pi}{N}}$$

where the sign is positive for IFFT processing and negative for FFT processing.

The radix-4 decimation-in-time and decimation-in-frequency FFTs enhance their speed by reusing results from smaller intermediate computations to compute multiple DFT frequency outputs. The radix-4 decimation-in-time algorithm rearranges the discrete Fourier transform (DFT) equation into four parts and sums over all groups of every fourth discrete-time index n=[0, 4, 8, ..., N−4], n=[1, 5, 9, ..., N−3], n=[2, 6, 10, ..., N−2] and n=[3, 7, 11, ..., N−1].

A polyphase decomposition of the input vector $x_{0:63}$ is expressed by:

$$X_n = \sum_{k=0}^{15} x_{4k} W_{64}^{n4k} + \sum_{k=0}^{15} x_{4k+1} W_{64}^{n(4k+1)} +$$

$$\sum_{k=0}^{15} x_{4k+2} W_{64}^{n(4k+2)} + \sum_{k=0}^{15} x_{4k+3} W_{64}^{n(4k+3)}$$

$$= \sum_{k=0}^{15} x_k^{(0)} W_{16}^{nk} + W_{64}^{n} \sum_{k=0}^{15} x_k^{(1)} W_{16}^{nk} +$$

$$W_{64}^{2n} \sum_{k=0}^{15} x_k^{(2)} W_N^{nk} + W_{64}^{3n} \sum_{k=0}^{15} x_k^{(3)} W_{16}^{nk}$$

where $x_k^{(p)} = x_{4k+1}$ is the $p^{th}$ phase of the polyphase decomposition of $x_{0:63}$. This equation shows that the FFT/IFFT for N=64 can be implemented as a combination of four small FFTs/IFFTs over 16 of the four phases of the input vector $x_{0:63}$. Now let $Z_n^{(p)}$ be the FFT/IFFT of the $p^{th}$ phase of $x_{0:63}$.

$$Z_n^{(p)} = \sum_{k=0}^{15} x_k^{(p)} W_{16}^{nk} \; n = 0:15$$

The $X_n$ can be expressed as $$X_n = Z_n^{(0)} + W_{64}^n Z_n^{(1)} + W_{64}^{2n} Z_n^{(2)} + W_{64}^{3n} Z_n^{(3)}$$

Since $Z_n^{(p)}$ is periodic with period 16, we can compute $X_n$, $X_{n+16}$, $X_{n+32}$, and $X_{n+48}$ together using a size-four FFT/IFFT $$X_n = Z_n^{(0)} + W_{64}^n Z_n^{(1)} + W_{64}^{2n} Z_n^{(2)} + W_{64}^{3n} Z_n^{(3)}$$

$$X_{n+16} = Z_n^{(0)} \mp j W_{64}^n Z_n^{(1)} - W_{64}^{2n} Z_n^{(2)} \pm j W_{64}^{3n} Z_n^{(3)}$$

$$X_{n+32} = Z_n^{(0)} - W_{64}^n Z_n^{(1)} + W_{64}^{2n} Z_n^{(2)} - W_{64}^{3n} Z_n^{(3)}$$

$$X_{n+48} = Z_n^{(0)} \pm j W_{64}^n Z_n^{(1)} - W_{64}^{2n} Z_n^{(2)} \mp j W_{64}^{3n} Z_n^{(3)}$$

where the upper sign is used for the FFT and the lower sign is used for the IFFT.

The multipliers may employ fixed coefficients and can be implemented either as generic multipliers with configurable coefficients, or as set of fixed-coefficient multipliers with a multiplexer. In this embodiment, the output of the last set of processing elements 208 comprises four FFTs/IFFTs of size 16 but in reverse order. For example, the output of one of the processing elements is:
$[Z_0^{(0)} Z_8^{(0)} Z_4^{(0)} Z_{12}^{(0)} Z_2^{(0)} Z_{10}^{(0)} Z_6^{(0)} Z_{14}^{(0)} Z_1^{(0)} Z_9^{(0)} Z_5^{(0)} Z_{13}^{(0)} Z_3^{(0)} Z_{11}^{(0)} Z_7^{(0)} Z_{15}^{(0)}]$ which may be denoted by:
$Z_n^{(0)}$ n=[0, 8, 4, 12, 2, 10, 6, 14, 1, 9, 5, 13, 3, 11, 7, 15]

In one embodiment, the processor is pipelined and can be fed one block of data after another. The processor produces an FFT/IFFT every 16 clock cycles, and the memories employed are of size 16, corresponding to the 16 clock cycles.

Figure 2C:
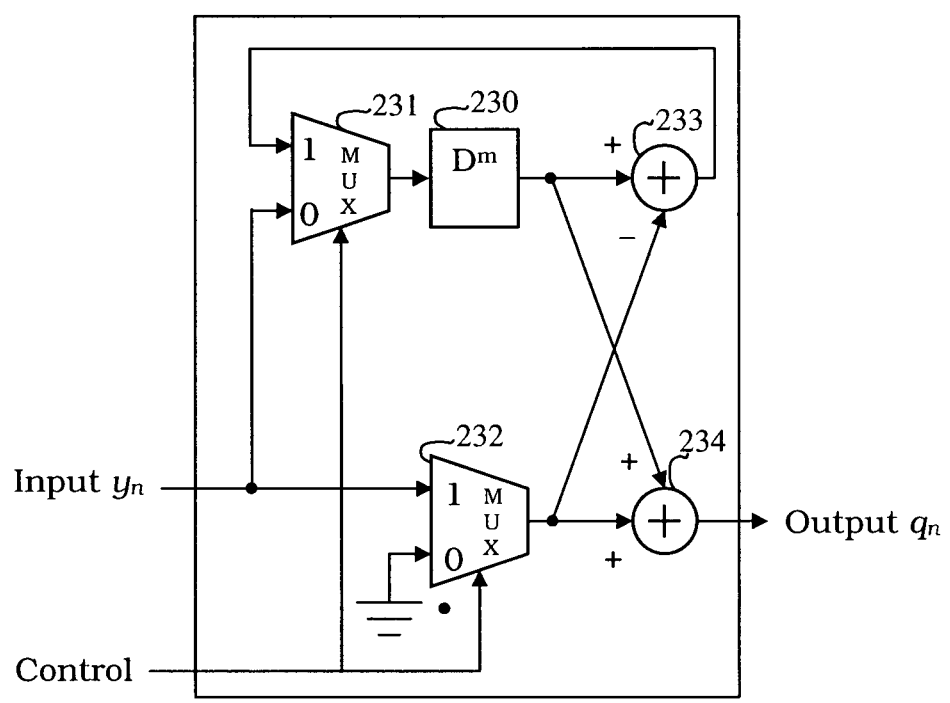
FIG. 2C is a diagram of one of the processing elements shown in FIG. 2A.

FIGS. 2C is a diagram of one of the processing elements, such as shown in FIG. 2A. The processing element is of order m (wherein memory $D^m$ 230 may be implemented as a register file) and performs one stage of a radix 2 Decimation In Frequency (DIF) implementation of an FFT/IFFT operation. A radix-2 DIF is represented by:

$$Y_n = \sum_{k=0}^{N-1} y_k W_N^{nk}$$

$$= \sum_{k=0}^{N/2-1} y_k W_N^{nk} + \sum_{k=0}^{N/2-1} y_{k+N/2} W_N^{n(k+N/2)}$$

$$= \sum_{k=0}^{N/2-1} y_k W_N^{nk} + (-1)^n \sum_{k=0}^{N/2-1} y_{k+N/2} W_N^{nk}$$

where $Y_{0:N-1}$ is the FFT/IFFT of input $y_{0:N-1}$. This expression can be written as $$Y_{2n} = \sum_{k=0}^{N/2-1} (y_{2k} + y_{k+N/2}) W_{N/2}^{nk}$$

$$Y_{2n+1} = \sum_{k=0}^{N/2-1} (y_{2k} - y_{k+N/2}) W_{N/2}^{nk}.$$

During the first N12 cycles, a control signal of 0 is input to the multiplexers 231 and 232. Input data $y_{0:N/2-1}$ is stored in the memory 230, and the output comprises N/2 zeros, which corresponds to the latency of this circuit. During the second N/2 cycles, the control signal is 1, and the resulting output of the first adder 233, $y_{n+N/2}-y_n$, is stored in the memory 230 using the feedback path. The second adder 234 outputs the values $y_{n+N/2}+y_n$. In the third N/2 cycles, the control signal is 0, the input data corresponds to the next data block, and the content of the memory 230, $y_{n+N/2}-y_n$, is output.

Figure 3:
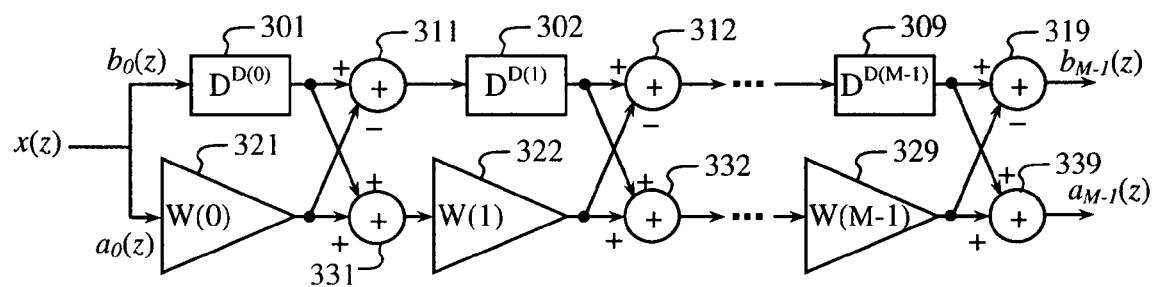
FIG. 3 illustrates a method and apparatus configured to perform Golay matched filtering in accordance with an embodiment of the invention.

FIG. 3 illustrates a method and apparatus configured to perform Golay matched filtering in accordance with an embodiment of the invention. A sequence of delay elements 301-309 is configured for providing a predetermined set of fixed delays D=[D(0), D(1), . . . , D(M−1)] to a first input signal. A sequence of adaptable seed vector insertion elements 321-329 is configured for multiplying a second input signal by at least one of a plurality of different seed vectors $W^i$=[$W^i(0), W^i(1), \ldots, W^i(M-1)$], i=1, . . . , L, where L is the number of piconets, and, thus, code pairs. Furthermore, a first set of combiners 311-319 and a second set of combiners 331-339 are configured for combining delayed signals with signals multiplied by the seed vector.

In one embodiment of the invention, a Golay matched filter comprising six stages may be matched to the Golay code pair a and b of length N=64, delay vector D=[D(1) D(2) D(3) D(4) D(5) D(6)]=[32 16 8 4 2 1], and seed vector W=[W(1) W(2) W(3) W(4) W(5) W(6)]. The function of the Golay processing operation may be expressed mathematically by $$\begin{bmatrix} a_m(z) \\ b_m(z) \end{bmatrix} = \begin{bmatrix} W_m & z^{-D_m} \\ W_m & -z^{-D_m} \end{bmatrix} \begin{bmatrix} a_{m-1}(z) \\ b_{m-1}(z) \end{bmatrix} \quad m = 1:6$$

with $$a_0(z) = b_0(z) = x(z),$$

where $a_m(z)$ and $b_m(z)$ denote outputs of the $m^{th}$ stage.

An embodiment of the invention may provide for a parallel Golay receiver (and, thus, parallel receiver processing) with the same parallel factor of four as the FFT/IFFT processor shown in FIGS. 2A and 2B. A z-transform u(z) of input sequence u(n) can be written in terms of its polyphase decomposition as:

$$u(z) = u^{(0)}(z) + z^{-1}u^{(1)}(z) + z^{-2}u^{(2)}(z) + z^{-3}u^{(3)}(z),$$

where $$u^{(p)}(z) = \sum_k u(4k+p)z^{-4k}$$

For stages one through four, the $p^{th}$ phase of $a_m(z)$ and $b_m(z)$ can be computed as:

$$\begin{bmatrix} a_m^{(p)}(z) \\ b_m^{(p)}(z) \end{bmatrix} = \begin{bmatrix} W_m & z^{-D_m/4} \\ W_m & -z^{-D_m/4} \end{bmatrix} \begin{bmatrix} a_{m-1}^{(p)}(z) \\ b_{m-1}^{(p)}(z) \end{bmatrix} \quad p = 0:3.$$

Figure 4A:
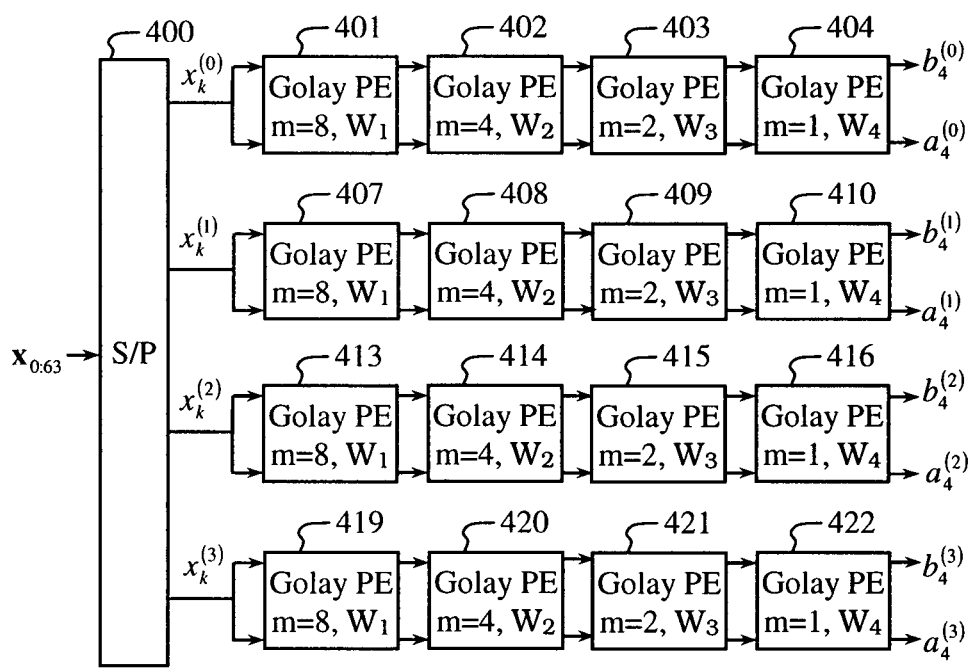
FIG. 4A shows the first four stages of a parallel Golay receiver in accordance with an embodiment of the invention.

FIG. 4A shows the first four stages of the parallel Golay receiver in accordance with an embodiment of the invention. A serial-to-parallel converter (S/P) 400 converts a received digital sequence into a plurality of parallel symbol streams. A plurality of Golay processing elements 401-422 provide for matched-filtering the received signal.

Embodiments of the invention may be configured for matched filtering Golay complementary code pairs having a common length or different lengths. The matched filter may be configured for processing all mother codes and/or daughter codes used by a plurality of piconets. In such embodiments, the matched filter may be configurable by programming at least one seed vector. Furthermore, the matched filter may be configured for decoding an entire frame, comprising a preamble, header, and packet payload.

Figure 4B:
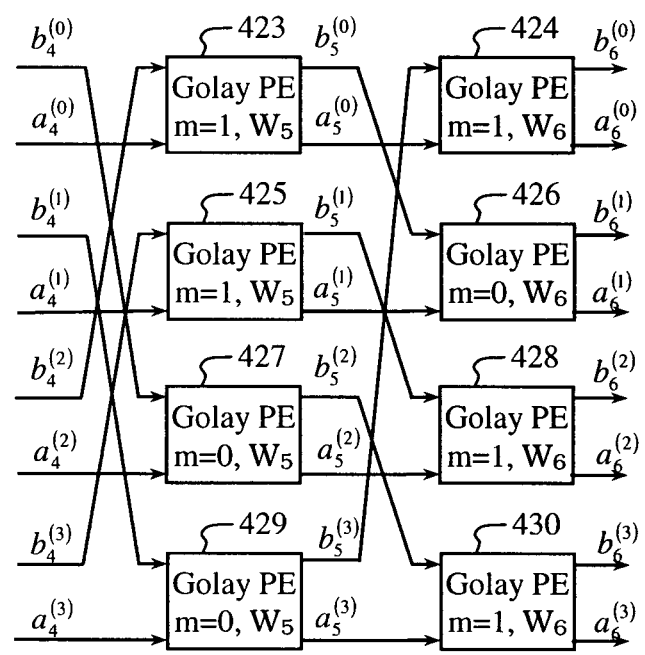
FIG. 4B shows fifth and sixth stages of the parallel Golay receiver.

FIG. 4B shows stages five and six of the parallel Golay receiver in accordance with an embodiment of the invention and comprising Golay processing elements 423-430. For stages 5 and 6, the $p^{th}$ phase of $a_m(z)$ and $b_m(z)$ may be expressed mathematically as $$\begin{bmatrix} a_5^{(p)}(z) \\ b_5^{(p)}(z) \end{bmatrix} = \begin{bmatrix} W_5 & z^{-1} \\ W_5 & -z^{-1} \end{bmatrix} \begin{bmatrix} a_4^{(p)}(z) \\ b_4^{(p+2)mod4}(z) \end{bmatrix}$$

for $p = 0, 1$ and $$\begin{bmatrix} a_5^{(p)}(z) \\ b_5^{(p)}(z) \end{bmatrix} = \begin{bmatrix} W_5 & 1 \\ W_5 & -1 \end{bmatrix} \begin{bmatrix} a_4^{(p)}(z) \\ b_4^{(p+2)mod4}(z) \end{bmatrix}$$

for $p = 2, 3$ $$\begin{bmatrix} a_6^{(p)}(z) \\ b_6^{(p)}(z) \end{bmatrix} = \begin{bmatrix} W_6 & z^{-1} \\ W_6 & -z^{-1} \end{bmatrix} \begin{bmatrix} a_4^{(p)}(z) \\ b_4^{(p+3)mod4}(z) \end{bmatrix}$$

for $p = 0$ and $$\begin{bmatrix} a_6^{(p)}(z) \\ b_6^{(p)}(z) \end{bmatrix} = \begin{bmatrix} W_6 & 1 \\ W_6 & -1 \end{bmatrix} \begin{bmatrix} a_5^{(p)}(z) \\ b_5^{(p+3)mod4}(z) \end{bmatrix}$$

for $p = 1, 2, 3$

Figure 4C:
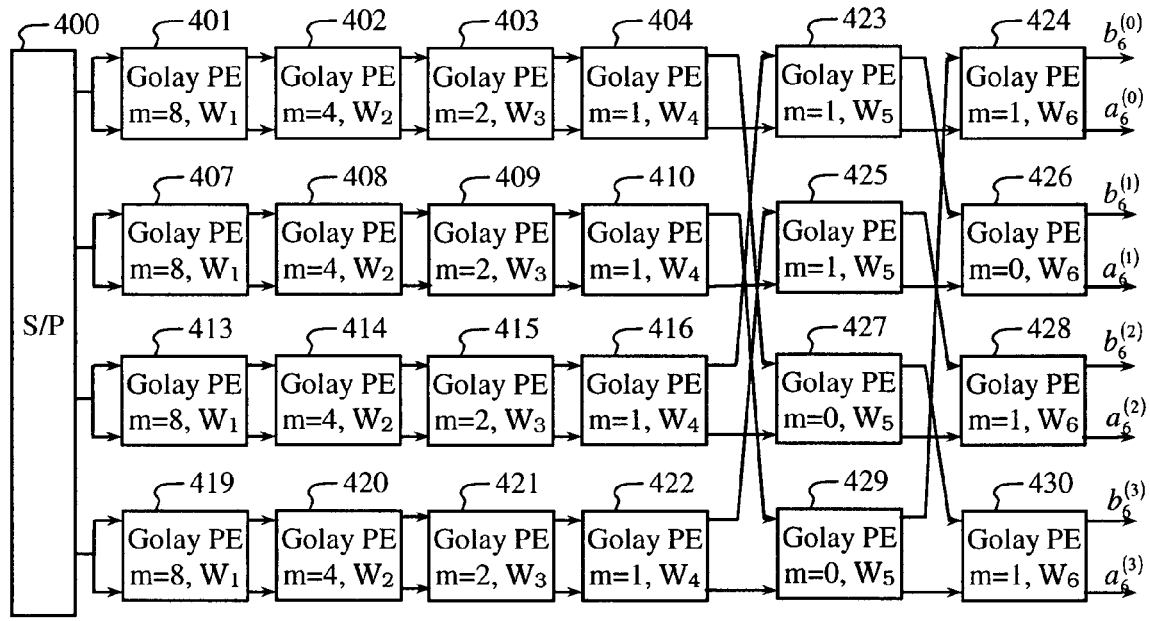
FIG. 4C shows a Golay receiver comprising the circuits shown in FIGS. 4A and 4B, and having a parallelism factor of four.

FIG. 4C shows a Golay receiver comprising the circuits shown in FIGS. 4A and 4B. The circuit shown in FIG. 4C is an exemplary implementation with a parallelism factor of four. As in the case of the FFT/IFFT processor, the Golay processor is four times faster than a corresponding serial processor because it accepts four inputs at a time (corresponding to the four phases of the polyphase decomposition of the input) and produces four output pairs at a time (corresponding to the four phases of the polyphase decomposition of the output pair). This circuit may be implemented as a pipelined processor that can be provided with input data continuously. The outputs represent a polyphase decomposition of the matched filter to Golay code pairs a and b. However, alternative embodiments of the invention may comprise different circuit configurations and/or alternative parallelism factors.

Figure 4D:
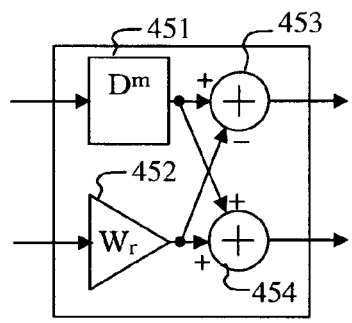
FIG. 4D is a block diagram of one of the Golay processing elements shown in FIG. 4C.

FIG. 4D is a block diagram of one of the Golay processing elements 401-430, such as shown in FIG. 4C. A first signal input is coupled to a delay element 451. A second signal input is coupled to a seed-vector insertion element 452. Outputs from the delay element 451 and the seed-vector insertion element 452 are combined in adders 453 and 454.

Figure 5A:
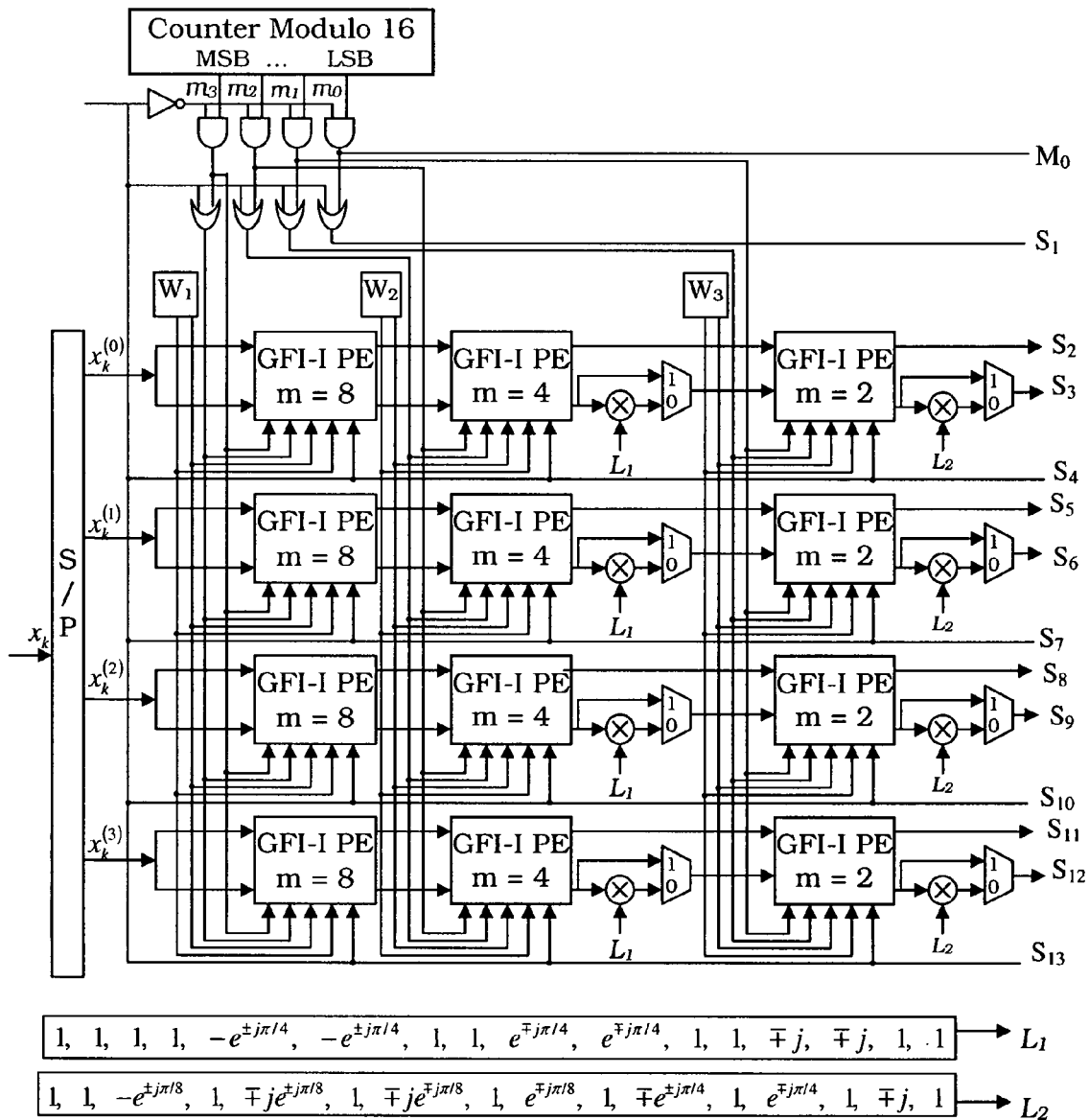
FIGS. 5A and 5B show is a block diagram of a processor configured to perform FFY, IFFT, and Golay processing in accordance with an embodiment of the invention.
Figure 5B:
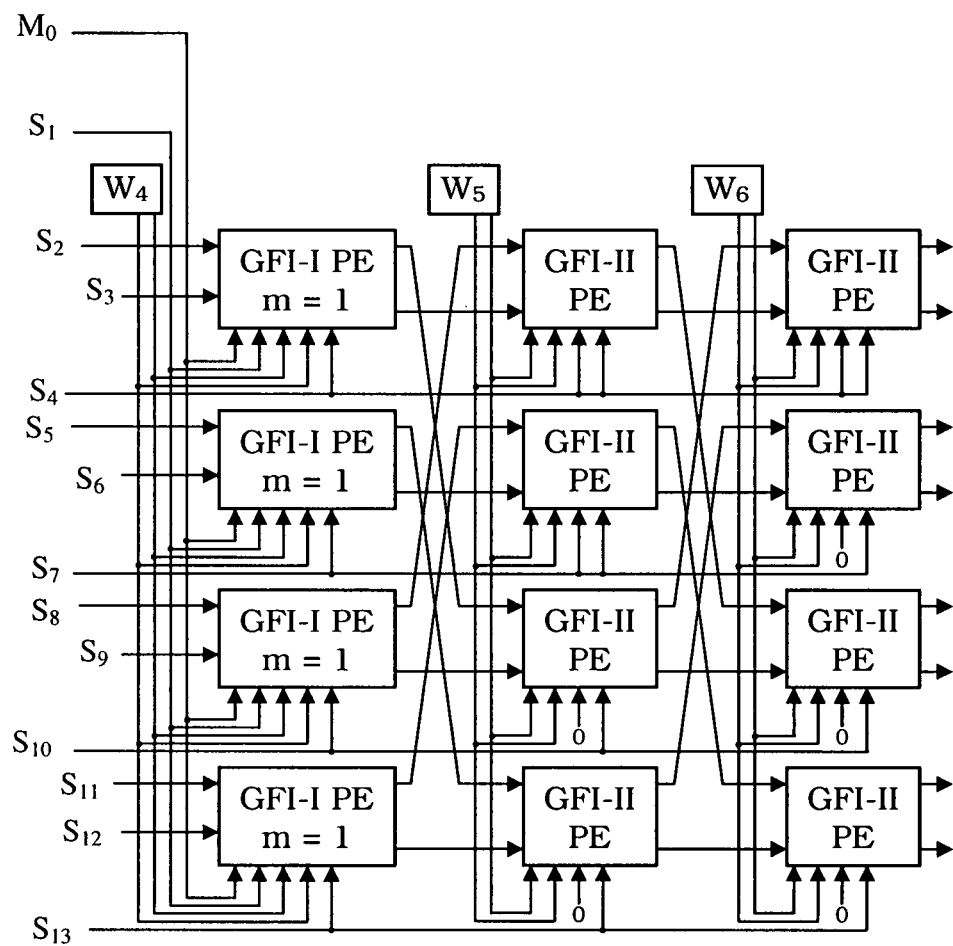

FIGS. 5A and 5B illustrates a processor configured to perform FFT, IFFT, and Golay processing. A first stage of processing elements is labeled GFI-II PE m=8. A second stage of processing elements is labeled GFI-I PE m=4, a third stage of processing elements is labeled GFI-I PE m=2, and a fourth stage of processing elements is labeled GFI-I PE m=1. Fifth and sixth stages of processing elements are labeled GFI-II PE. Input weights $W_k$ are coded as two bits each as follows:

$W_k=+1 \Leftrightarrow 00$, $W_k=-1 \Leftrightarrow 01$, $W_k=+j \Leftrightarrow 10$, $W_k=-j \Leftrightarrow 11$.

The processor may be employed as a matched filter to any Golay code of length 64, 32, 8, 4, or 2. For example, for a Golay code length of 32, the first stage may be bypassed. Therefore, some embodiments of the invention may employ multiplexers (not shown) configured for bypassing one or more stages of the processor.

In FFT and IFFT modes, twiddle-factor multipliers shown in FIG. 5A are configured to multiply intermediate signals in the processor by coefficients from memories L1 and L2. Alternatively, multiplexers (not shown) configured for selecting between a predetermined set of coefficients may be employed. In another embodiment of the invention, the processor may implement a fast Walsh-Hadamard transform by configuring each of the processing elements for FFT/IFFT processing and bypassing the multipliers.

Figure 6A:
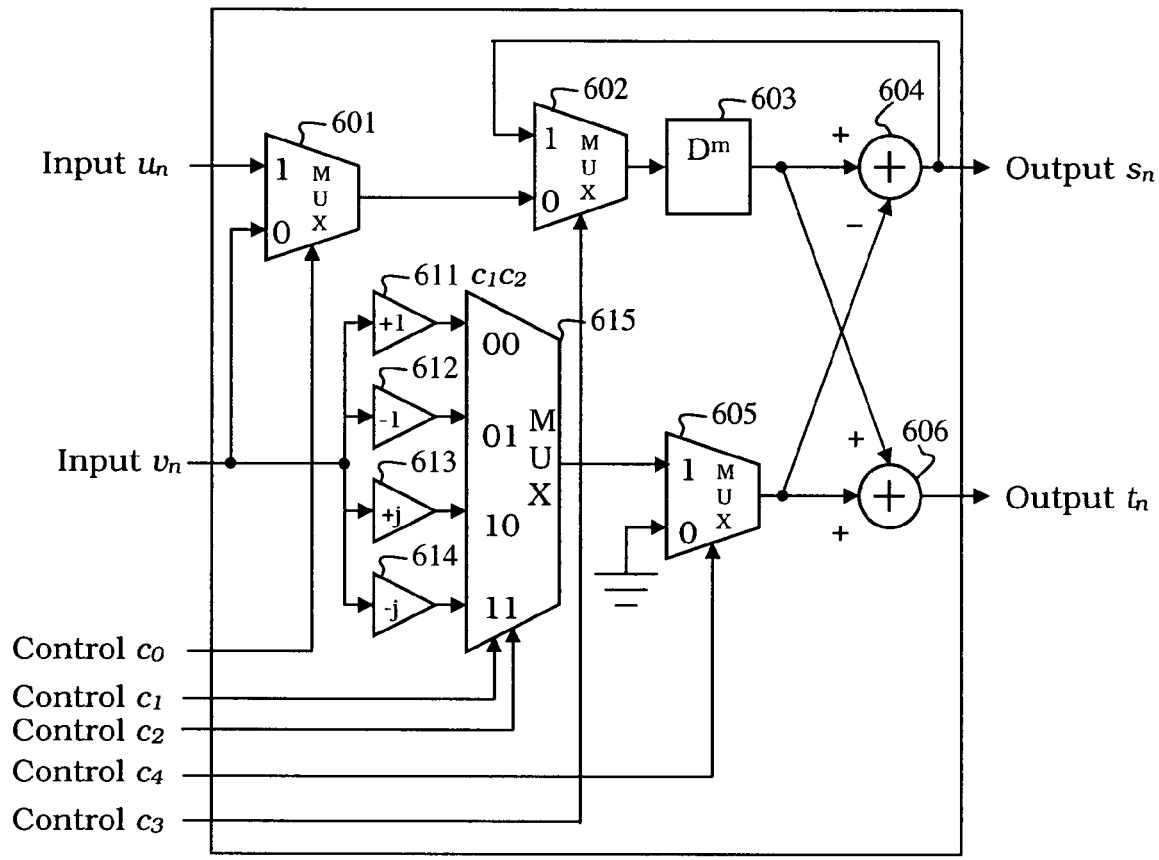
FIG. 6A is a block diagram of a processing element that may be used in stages one through four of the processor shown in FIGS. 5A and 5B.

FIG. 6A is a block diagram of a processing element of the type GFI-I, such as may be used in stages one through four. A first signal input is coupled to a first multiplexer 601. A second signal input is coupled to the first multiplexer 601 and to a set of seed-vector insertion elements 611-614 coupled to a second multiplexer 615. The second multiplexer 615 is configured in one of the positions "00", "01", "11", or "10" depending on whether the current seed-vector value is −1, +1, +j, or −j, respectively. A delay element 603 is coupled after multiplexer 602. Multiplexers 601, 602, and 605 are configured with respect to control signals $c_0$, $c_3$, and $c_4$, respectively, for controlling the operating mode. For example, to configure the processing element for the FFT/IFFT mode, the control signals are set to $c_0=0$, $c_1c_2=00$, and $c_3=c_4$ is set to the Most Significant Byte (msb) of a multi-byte value of a counter modulo 2m. To configure the processing element for Golay processing, the control signals are set to $c_0=1$, $c_1$ and $c_2$ depend on the weight $W_k$, $c_3=1$, and $c_4=0$.

Figure 6B:
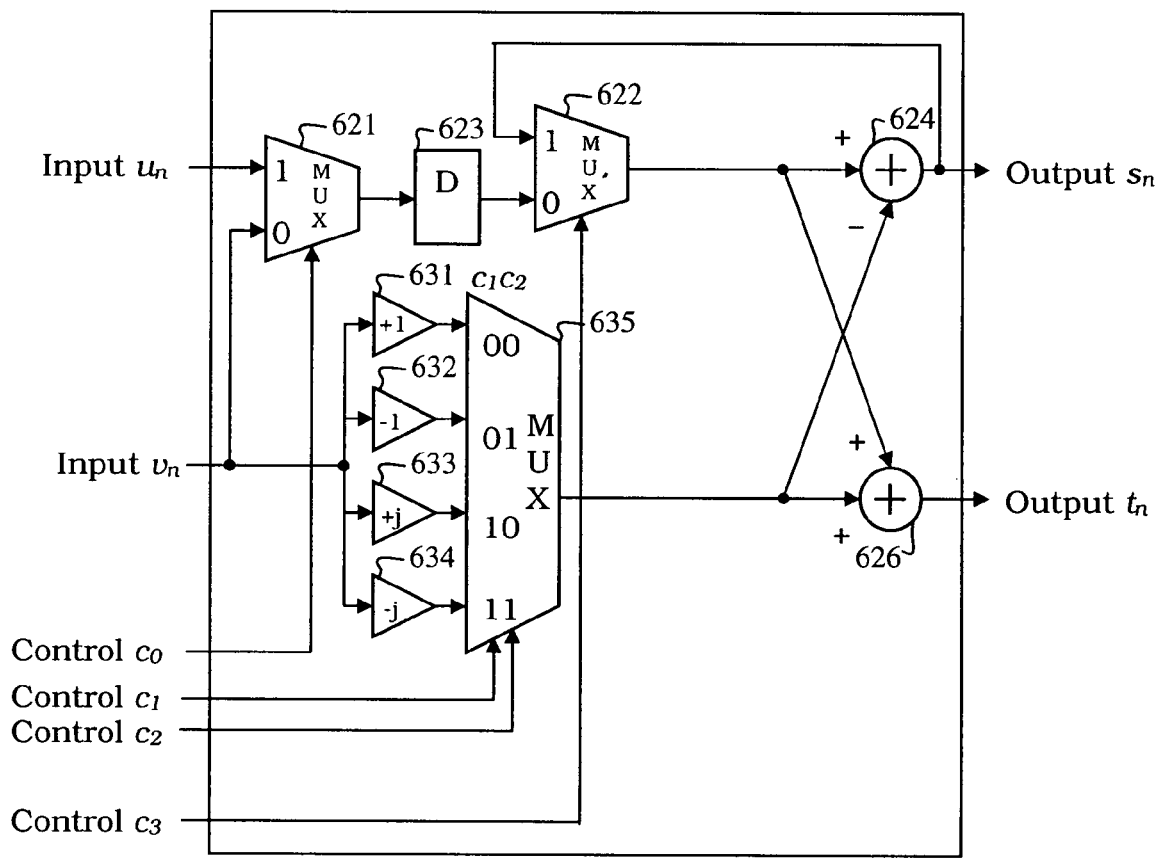
FIG. 6B is a block diagram of a processing element that may be used in stages five and six of the processor shown in FIG. 5B.

FIG. 6B is a block diagram of a processing element of the type GFI-II, such as may be used in stages five and six. A first signal input is coupled to a first multiplexer 621. A second signal input is coupled to the first multiplexer 621 and to a set of seed-vector insertion elements 631-634 coupled to a second multiplexer 635. The second multiplexer 635 is configured in one of the positions "00", "01", "11", or "10" depending on whether the current seed-vector value is −1, +1, +j, or −j, respectively. A delay element 623 is coupled between multiplexers 621 and 622. Multiplexers 621 and 622 are configured with respect to control signals $c_0$ and $c_3$, respectively, for controlling the operating mode. For example, to configure the processing element for an FFT/IFFT processing mode, the control signals are set to $c_0=0$, $c_1c_2=00$, and $c_3=0$. To configure the processing element for Golay processing, the control signals are set to $c_0=1$, $c_1c_2$ depends on the weight $W_k$, and $c_3$ is 0 or 1 depending on whether or not a delay is employed.

In some embodiments of the invention, a single processor may be used for packet detection and data demodulation in both single carrier and OFDM systems. In one embodiment, a single device may provide for processing both single carrier and OFDM signals in a received transmission. The scope of the invention should not be interpreted as being limited to the type of ordering illustrated in the embodiments. Rather, the Applicants anticipate that alternative code-set orderings may be implemented, and that such orderings fall within the scope and spirit of the invention.

Embodiments of the invention may be configured for multi-band operation. For example, in one embodiment of the invention, transceivers may provide for four channels to cover the spectrum of 57 GHz-66 GHz in the United States. Similarly, three channels may be provided for covering 59 GHz-66 GHz in Japan. An exemplary set of channel parameters is shown in the following table.

| Channel Number | Low Freq. (MHz) | Center Freq. (MHz) | High Freq. (MHz) | 3 dB BW (MHz) | Roll-Off Factor |
|---|---|---|---|---|---|
| 1 | 57240 | 58320 | 59400 | 1620.00 | 0.333 |
| 2 | 59400 | 60480 | 61560 | 1680.00 | 0.286 |
| 3 | 61560 | 62640 | 63720 | 1740.00 | 0.241 |
| 4 | 63720 | 64800 | 65880 | 1800.00 | 0.200 |

A single integer PLL employing direct synthesis may be used to generate the carrier (i.e., center) frequency for each channel and the analog-to-digital and digital-to-analog (ADC) clock signals. In one embodiment, an integer-power-of-two relation is employed between center frequencies and channel bandwidth. In another embodiment, product-of-three relationship may be employed between center frequencies and channel bandwidth. Embodiments may employ both integer-power-of-two and product-of-three relationships between carrier frequencies and channel bandwidth. High-frequency dividers in the PLL may be configured as powers of two and/or three, whereas low-frequency dividers may be programmable.

Figure 7A:
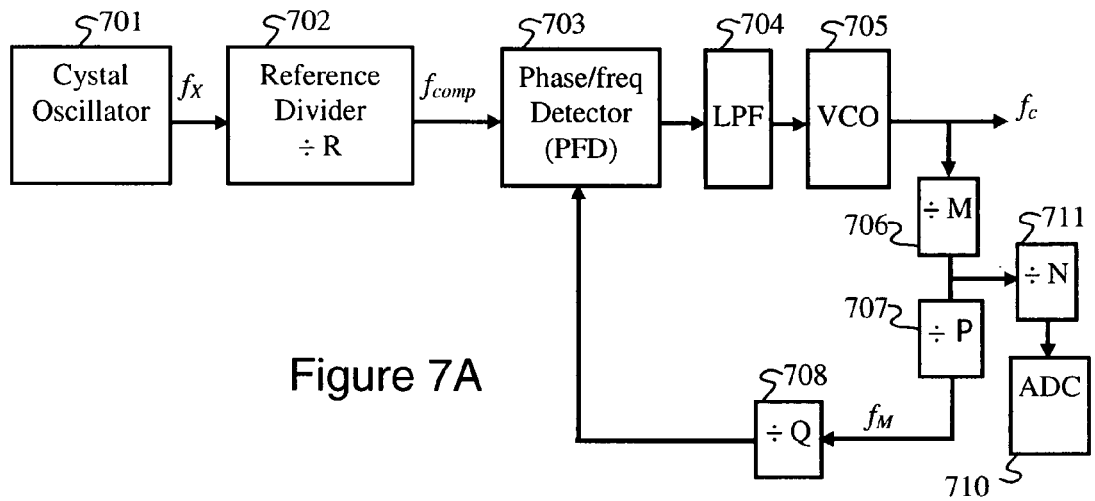
FIG. 7A is a block diagram of a voltage controlled oscillator-based phase locked loop (PLL) frequency synthesizer in accordance with one embodiment of the invention.

FIG. 7A illustrates a block diagram of a voltage controlled oscillator-based phase locked loop (PLL) frequency synthesizer in accordance with one embodiment of the invention. The PLL frequency synthesizer is configured to produce frequencies coherent to a reference frequency. A crystal oscillator 701 produces the reference signal, which may be divided prior to being coupled into a PLL circuit. An input reference counter may be used as a reference divider 702 to reduce the reference input frequency (i.e., divide the reference signal by a factor "R"). In the case where R=1, the reference divider 702 may be bypassed or eliminated from the circuit.

The PLL circuit comprises a phase/frequency detector (PFD) 703, a low pass filter (LPF) 704, and a voltage-controlled oscillator (VCO) 705. The PLL is typically formed as a single phase locked loop semiconductor chip, and may include other circuit components known to those skilled in the art. The PFD 703 compares a feedback frequency with a divided-down version of the reference frequency. A signal from the PFD 703 is output to the LPF 704, which passes signals only below a predetermined cut-off frequency. The resulting error signal becomes a varying DC-level signal used to control the frequency of the VCO 705, moving the PFD's 703 average output towards zero.

The signal output from the VCO 705 is coupled into a feedback loop comprising frequency dividers 706, 707, and 708 that can be operative for dividing the signal output before coupling the resulting divided signal back into the PFD 703. For example, feedback counters may be used to reduce the output frequency for comparison with the scaled reference frequency. In an integer PLL frequency synthesizer, the output frequency is divided by an integer. The input frequency is multiplied by the ratio of the feedback divider (M*P*Q) to the reference divider (R) to generate the VCO 705 output frequency. Programmable divider circuits in the feedback loop between the VCO 705 and the PFD 703 divide the voltage controlled output signal by a factor "M*P*Q". By programming the values of R, M, P, and Q, the VCO 705 output signal can be made equal to a desired multiple of the reference frequency. A microcontroller (not shown) may be operative with the PLL circuit for configuring the divide ratio. The output from the voltage VCO 705 is multiplied to produce the output carrier frequency.

A divider 711 may be used to divide a signal frequency prior to coupling to an ADC 710. Embodiments of the invention provide for an ADC 710 clock frequency that is an integer multiple of half the bandwidth. For Nyquist operation, the ADC 710 would run at exactly the bandwidth. For two times over-sampling, the ADC 710 clock would be twice the bandwidth.

Figure 7B:
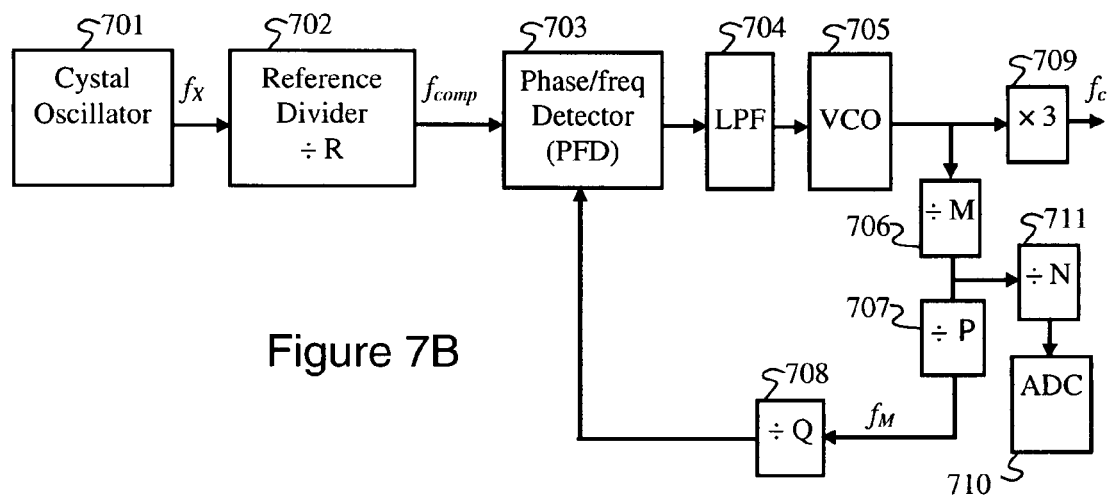
FIG. 7B illustrates a voltage controlled oscillator-based PLL frequency synthesizer in accordance with another embodiment of the invention.
Figure 7C:
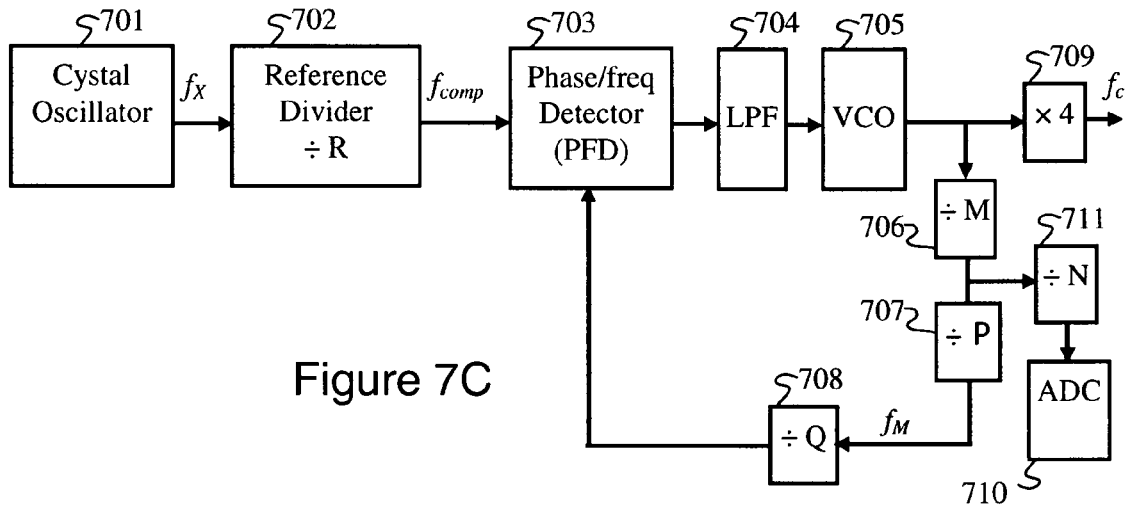
FIG. 7C shows a voltage controlled oscillator-based PLL frequency synthesizer in accordance with yet another embodiment of the invention.

FIG. 8 illustrates operating parameters employed in some of the possible embodiments of the invention given a crystal oscillator frequency $f_X$ of 45 MHz. A configuration number of I, II, and III corresponds to frequency synthesizer embodiments shown in FIGS. 7A, 7B, and 7C, respectively. The value $f_c$ is the channel carrier frequency for each of four channels produced by the frequency synthesizer embodiments. ADC/BW indicates the ratio of the ADC's 710 clock frequency to the bandwidth, and values M, N, P, and Q are programmable frequency-divider values.

Figure 7D:
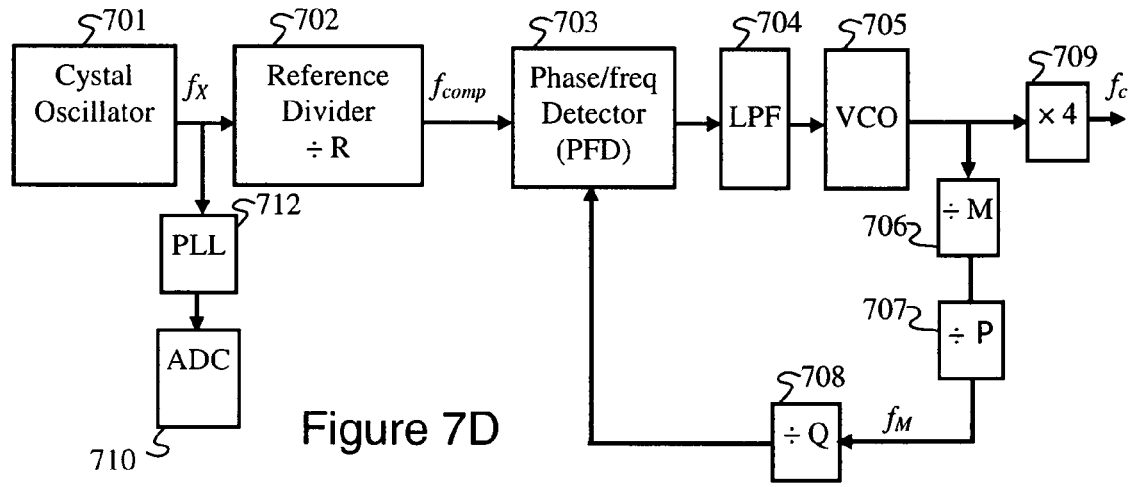
FIG. 7D illustrates a voltage controlled oscillator-based PLL frequency synthesizer in accordance with a further embodiment of the invention.

In one embodiment of the invention, the same bandwidth (e.g., a bandwidth of 1620 MHz) may be employed for the four channels, in which case a separate PLL 712, such as shown in FIG. 7D, is used. The roll-off factor would be the same in this case.

It should be appreciated that the apparatus and method embodiments of the invention may be implemented using a variety of hardware and software. For example, a Golay-code generator may be implemented using special-purpose hardware, such as an application specific integrated circuit (ASIC) and programmable logic devices such as gate arrays, and/or software or firmware running on a computing device, such as a microprocessor, microcontroller or digital signal processor (DSP). It also will be appreciated that although functions of the Golay-code generator may be integrated in a single device, such as a single ASIC, they may also be distributed among several devices.

The invention is not intended to be limited to the preferred embodiments. Furthermore, those skilled in the art should recognize that the method and apparatus embodiments described herein may be implemented in a variety of ways, including implementations in hardware, software, firmware, or various combinations thereof. Examples of such hardware may include ASICs, Field Programmable Gate Arrays, general-purpose processors, DSPs, and/or other circuitry. Software and/or firmware implementations of the invention may be implemented via any combination of programming languages, including Java, C, C++, Matlab™, Verilog, VHDL, and/or processor specific machine and assembly languages.

Computer programs (i.e., software and/or firmware) implementing the method of this invention may be distributed to users on a distribution medium, such as a SIM card, a USB memory interface, or other computer-readable memory adapted for interfacing with a wireless terminal. Similarly, computer programs may be distributed to users via wired or wireless network interfaces. From there, they will often be copied to a hard disk or a similar intermediate storage medium. When the programs are to be run, they may be loaded either from their distribution medium or their intermediate storage medium into the execution memory of a wireless terminal, configuring an onboard digital computer system (e.g. a microprocessor) to act in accordance with the method of this invention. All these operations are well known to those skilled in the art of computer systems.

The term "computer-readable medium" encompasses distribution media, intermediate storage media, execution memory of a computer, and any other medium or device capable of storing for later reading by a digital computer system a computer program implementing the method of this invention.

Various digital computer system configurations can be employed to perform the method embodiments of this invention, and to the extent that a particular system configuration is capable of performing the method embodiments of this invention, it is equivalent to the representative system embodiments of the invention disclosed herein, and within the scope and spirit of this invention.

Once digital computer systems are programmed to perform particular functions pursuant to instructions from program software that implements the method embodiments of this invention, such digital computer systems in effect become special-purpose computers particular to the method embodiments of this invention. The techniques necessary for this programming are well known to those skilled in the art of computer systems.

Various embodiments of the invention may include variations in system configurations and the order of steps in which methods are provided. In many cases, multiple steps and/or multiple components may be consolidated.

The method and system embodiments described herein merely illustrate particular embodiments of the invention. It should be appreciated that those skilled in the art will be able to devise various arrangements, which, although not explicitly described or shown herein, embody the principles of the invention and are included within its spirit and scope. Furthermore, all examples and conditional language recited herein are intended to be only for pedagogical purposes to aid the reader in understanding the principles of the invention. This disclosure and its associated references are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

It should be appreciated by those skilled in the art that the block diagrams herein represent conceptual views of illustrative circuitry, algorithms, and functional steps embodying principles of the invention. Similarly, it should be appreciated that any flow charts, flow diagrams, signal diagrams, system diagrams, codes, and the like represent various processes that may be substantially represented in computer-readable medium and so executed by a computer or processor, whether or not such computer or processor is explicitly shown.

The functions of the various elements shown in the drawings, including functional blocks labeled as "processors" or "systems," may be provided through the use of dedicated hardware as well as hardware capable of executing software in association with appropriate software. When provided by a processor, the functions may be provided by a single dedicated processor, by a shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, read-only memory (ROM) for storing software, random access memory (RAM), and non-volatile storage. Other hardware, conventional and/or custom, may also be included. Similarly, the function of any component or device described herein may be carried out through the operation of program logic, through dedicated logic, through the interaction of program control and dedicated logic, or even manually, the particular technique being selectable by the implementer as more specifically understood from the context.

Any element expressed herein as a means for performing a specified function is intended to encompass any way of performing that function including, for example, a combination of circuit elements which performs that function, or software in any form, including, therefore, firmware, micro-code or the like, combined with appropriate circuitry for executing that software to perform the function. Embodiments of the invention as described herein reside in the fact that the functionalities provided by the various recited means are combined and brought together in the manner which the operational descriptions call for. Applicant regards any means that can provide those functionalities as equivalent to those shown herein.

The invention claimed is:

1. An apparatus configured to perform both Fourier transform processing and Golay code processing, the apparatus comprising:
a plurality of processing elements, each of the processing elements comprising:
at least one delay element configured for providing a predetermined delay to at least a first input signal,
at least one seed vector insertion element configured for multiplying at least a second input signal by at least one seed-vector value for producing at least one scaled input signal value, and
at least one multiplexer configurable by at least one control signal for selecting an operating mode of the apparatus; and
at least one twiddle-factor multiplier coupled to at least one output of at least one of the plurality of processing elements.

2. The apparatus recited in claim 1, wherein each of the processing elements further comprises a set of multiplexers coupled to the at least one delay element and the at least one seed vector insertion element, the set of multiplexers configured for selecting at least one of a plurality of scaled input signal values.

3. The apparatus recited in claim 1, configured for performing at least one of a fast Fourier transform (FFT) and an inverse fast Fourier transform (IFFT).

4. The apparatus recited in claim 1, being configurable via at least one control signal to perform at least one of Golay processing and Fourier transform processing.

5. The apparatus recited in claim 1, being configured for Fourier transform processing and bypassing the at least one twiddle-factor multiplier to perform a fast Walsh-Hadamard transform.

6. The apparatus recited in claim 1, wherein the at least one twiddle-factor multiplier comprises at least one of a set, the set comprising a multiplier coupled to at least one memory and a multiplexer coupled to a plurality of multipliers.

7. The apparatus recited in claim 1, configured to perform matched filtering for Golay codes having a plurality of lengths.

8. The apparatus recited in claim 1, configured as a parallel processor.

9. The apparatus recited in claim 1, configured for performing packet detection and data demodulation of at least one of a set of signals comprising single-carrier signals and OFDM signals.

10. The apparatus recited in claim 1, configured for generating a signal for transmission and for receiving a transmitted signal.

11. A method for performing both Fourier transform processing and Golay code processing, the method comprising:
providing for a plurality of processing steps, each of the processing steps comprising:
providing for delaying at least a first input signal,
providing for multiplying at least a second input signal by at least one seed-vector value for producing at least one scaled input signal value, and
providing for selecting at least one signal for at least one of delaying and multiplying with respect to at least one predetermined operating mode; and
providing for multiplying at least one signal output from at least one of the plurality of processing steps with at least one twiddle factor when the at least one predetermined operating mode comprises an OFDM mode.

12. The method recited in claim 11, wherein providing for multiplying at least a second input signal by at least one seed-vector value further comprises selecting at least one of a plurality of scaled input signal values.

13. The method recited in claim 11, configured for performing at least one of a fast Fourier transform (FFT) and an inverse fast Fourier transform (IFFT).

14. The method recited in claim 11, being configurable via at least one control signal to perform at least one of Golay processing and Fourier transform processing.

15. The method recited in claim 11, being configured for Fourier transform processing and bypassing the step of providing for multiplying at least one signal output to perform a fast Walsh-Hadamard transform.

16. The method recited in claim 11, wherein providing for multiplying at least one signal output comprises retrieving the at least one twiddle factor from at least one memory.

17. The method recited in claim 11, wherein providing for multiplying at least one signal output comprises multiplexing at least one of a plurality of signal values.

18. The method recited in claim 11, configured to perform matched filtering for Golay codes having a plurality of lengths.

19. The method recited in claim 11, configured to perform parallel processing.

20. The method recited in claim 11, configured for performing packet detection and data demodulation of at least one of a set of signals comprising single-carrier signals and OFDM signals.

21. The method recited in claim 11, configured for generating a signal for transmission and for receiving a transmitted signal.

22. A digital computer system programmed to perform the method recited in claim 11.

23. A non-transitory computer-readable medium storing a computer program implementing the method of claim 11.

24. A system configured to perform both Fourier transform processing and Golay code processing, the system comprising:
a multi-stage processing means comprising a plurality of processing stages, each of the processing stages comprising:
at least one delaying means configured for providing a predetermined delay to at least a first input signal,
at least one seed vector insertion means configured for multiplying at least a second input signal by at least one seed-vector value for producing at least one scaled input signal value, and at least one multiplexing means configurable by at least one control signal for selecting an operating mode of the apparatus; and at least one twiddle-factor multiplication means coupled to at least one output of at least one of the plurality of processing stages.

25. The system recited in claim 24, wherein each of the processing stages further comprises a multiplexing means coupled to the at least one delaying means and the at least one seed vector insertion means, the multiplexing means configured for selecting at least one of a plurality of scaled input signal values.

26. The system recited in claim 24, configured for performing at least one of a fast Fourier transform (FFT) and an inverse fast Fourier transform (IFFT).

27. The system recited in claim 24, being configurable via at least one control signal to perform at least one of Golay processing and Fourier transform processing.

28. The system recited in claim 24, being configured for Fourier transform processing and bypassing the at least one twiddle-factor multiplication means to perform a fast Walsh-Hadamard transform.

29. The system recited in claim 24, wherein the at least one twiddle-factor multiplication means comprises at least one of a set, the set comprising a first multiplying means coupled to at least one memory-storage means and a multiplexing means coupled to a second multiplying means.

30. The system recited in claim 24, configured to perform matched filtering for Golay codes having a plurality of lengths.

31. The system recited in claim 24, configured as a parallel processor.

32. The system recited in claim 24, configured for performing packet detection and data demodulation of at least one of a set of signals comprising single-carrier signals and OFDM signals.

33. The system recited in claim 24, configured for generating a signal for transmission and for receiving a transmitted signal.

* * * * *